(12) United States Patent
Minoshima

(10) Patent No.: US 12,501,598 B2
(45) Date of Patent: Dec. 16, 2025

(54) MANAGEMENT APPARATUS, MOUNTING SYSTEM, AND MANAGEMENT METHOD

(71) Applicant: FUJI CORPORATION, Chiryu (JP)

(72) Inventor: Nobuaki Minoshima, Tougou-cho (JP)

(73) Assignee: FUJI CORPORATION, Chiryu (JP)

( * ) Notice: Subject to any disclaimer, the term of this patent is extended or adjusted under 35 U.S.C. 154(b) by 593 days.

(21) Appl. No.: 17/906,678

(22) PCT Filed: Mar. 23, 2020

(86) PCT No.: PCT/JP2020/012719
§ 371 (c)(1),
(2) Date: Sep. 19, 2022

(87) PCT Pub. No.: WO2021/191968
PCT Pub. Date: Sep. 30, 2021

(65) Prior Publication Data
US 2023/0180449 A1    Jun. 8, 2023

(51) Int. Cl.
*H05K 13/08* (2006.01)
*H05K 13/02* (2006.01)
*H05K 13/04* (2006.01)

(52) U.S. Cl.
CPC ....... *H05K 13/0882* (2018.08); *H05K 13/021* (2013.01); *H05K 13/0417* (2013.01); *H05K 13/086* (2018.08)

(58) Field of Classification Search
CPC ............. H05K 13/0882; H05K 13/021; H05K 13/0417; H05K 13/086
See application file for complete search history.

(56) References Cited

U.S. PATENT DOCUMENTS 4,979,286 A * 12/1990 Nakayama ........... H05K 13/041
294/183
6,842,974 B1 * 1/2005 Maenishi ........... H05K 13/0478
29/840
(Continued)

FOREIGN PATENT DOCUMENTS

CN          112205094 A  *  1/2021   ......... H05K 13/0419
EP          3471526 A1  *  4/2019   ............. G06F 11/08
(Continued)

OTHER PUBLICATIONS

Translation of CN-112205094-A (Year: 2021).*
(Continued)

*Primary Examiner* — Jeffrey T Carley
(74) *Attorney, Agent, or Firm* — Oblon, McClelland, Maier & Neustadt, L.L.P.

(57) ABSTRACT

A management apparatus of the present disclosure is an apparatus used in a mounting system including multiple mounting-related devices each having an attachment portion to which a second member used in combination with a first member is attached and related to a process of mounting a component on a processing target object, and a moving work device that is moved between the mounting-related devices and automatically attaches and detaches the second member to and from the attachment portion. The management apparatus is configured to, when cancelation information indicating that the second member has been detached from the attachment portion of the mounting-related device is acquired and collecting information indicating that the moving work device has detached the second member from the attachment portion is not acquired, execute a process of setting the second member as a restriction target.

5 Claims, 5 Drawing Sheets

(56) References Cited

U.S. PATENT DOCUMENTS

| | | | |
|---|---|---|---|
| 9,615,495 B2* | 4/2017 | Itoh | H05K 13/0465 |
| 9,669,980 B2* | 6/2017 | Koyanagi | H05K 13/046 |
| 11,516,952 B2* | 11/2022 | Matsushita | H05K 13/084 |
| 12,108,538 B2* | 10/2024 | Sanji | H05K 13/0882 |
| 2004/0188017 A1* | 9/2004 | Davis | H05K 13/021 |
| | | | 156/701 |
| 2012/0240388 A1* | 9/2012 | Ishimoto | H05K 13/08 |
| | | | 29/593 |
| 2012/0285628 A1* | 11/2012 | Katsumi | H05K 13/0419 |
| | | | 156/767 |
| 2015/0013152 A1* | 1/2015 | Tada | H05K 13/0404 |
| | | | 29/739 |
| 2015/0033555 A1* | 2/2015 | Mizokami | H05K 13/085 |
| | | | 29/832 |
| 2015/0110588 A1* | 4/2015 | Ohyama | H05K 13/0419 |
| | | | 414/810 |

FOREIGN PATENT DOCUMENTS

| | | | |
|---|---|---|---|
| EP | 3927131 A1 * | 12/2021 | H05K 13/021 |
| JP | 2015-32725 A | 2/2015 | |
| WO | WO 2017/033268 A1 | 3/2017 | |
| WO | WO-2019225009 A1 * | 11/2019 | |
| WO | WO 2019/229958 A1 | 12/2019 | |

OTHER PUBLICATIONS

Translation of WO-2019225009-A1 (Year: 2019).*
International Search Report Issued Jun. 23, 2020, in PCT/JP2020/012719, filed on Mar. 23, 2020, 2 pages.

* cited by examiner

MANAGEMENT APPARATUS, MOUNTING SYSTEM, AND MANAGEMENT METHOD

TECHNICAL FIELD

The present specification discloses a management apparatus, a mounting system, and a management method.

BACKGROUND ART

In the conventional art, as a mounting device, there has been proposed a device that calculates an attachment/detachment time from the time when a tape feeder is detached to the time when the tape feeder is attached again, and in a case where the attachment/detachment time is equal to or less than a predetermined time, and performs mounting work without performing a component collation operation for determining whether a component type of an electronic component housed in the tape feeder is correct (refer to Patent Literature 1, for example). In this mounting device, it is assumed that in the temporary detachment of the feeder, a work load is reduced to improve the work efficiency. As a mounting system, there has been proposed a feeder storage for storing multiple feeders attachable to and detachable from a mounting device, and an exchange robot (moving work device) capable of exchanging the feeders between the feeder storage and each mounting device (refer to Patent Literature 2, for example). In this mounting system, since the moving work device exchanges feeders, provision or collecting may be performed in the feeder storage regardless of a feeder used in any mounting device, and thus an operator can easily provide or collect a feeder.

PATENT LITERATURE

Patent Literature 1: JP-A-2015-32725
Patent Literature 2: International Publication No. WO2017/33268

BRIEF SUMMARY

Technical Problem

However, in the mounting device disclosed in Patent Literature 1 described above, automatic exchange of feeders has not been considered. In the mounting system disclosed in Patent Literature 2 described above, although each of the moving work device and the operator can exchange feeders, whether feeder exchange by the moving work device or feeder exchange by the operator is performed has not been considered. As described above, in a mounting system, it has been demanded to appropriately handle members in accordance with work of a moving work device and work of an operator.

The present disclosure has been made in view of such problems, and a principal object of the present disclosure is to provide a management apparatus, a mounting system, and a management method capable of more appropriately handling members in accordance with work of a moving work device and work of an operator.

Solution to Problem

The present disclosure employs the following means in order to achieve the above principal object.

According to the present disclosure, there is provided a management apparatus used in a mounting system including multiple mounting-related devices each having an attachment portion to which a second member used in combination with a first member is attached and related to a process of mounting a component on a processing target object, and a moving work device that is moved between the mounting-related devices and automatically attaches and detaches the second member to and from the attachment portion, the management apparatus including a management control section configured to, when cancelation information indicating that the second member has been detached from the attachment portion of the mounting-related device is acquired and collecting information indicating that the moving work device has detached the second member from the attachment portion is not acquired, execute a process of setting the second member as a restriction target, and configured to, when the cancelation information indicating that the second member has been detached from the attachment portion of the mounting-related device is acquired and the collecting information indicating that the moving work device has detached the second member from the attachment portion is acquired, execute a process of excluding the second member from the restriction target.

In the management apparatus, when cancelation information indicating that the second member used in combination with the first member has been detached from the attachment portion of the mounting-related device is acquired and collecting information indicating that the moving work device has detached the second member from the attachment portion is not acquired, a process of setting the second member as a restriction target is executed. On the other hand, in the management apparatus, the cancelation information indicating that the second member has been detached from the attachment portion of the mounting-related device is acquired and the collecting information indicating that the moving work device has detached the second member from the attachment portion is acquired, a process of excluding the second member from the restriction target is executed. For example, in a case where an operator has detached the second member from the attachment portion, since there is a probability that the operator may change the first member combined with the second member, the second member is set as a use restriction target. On the other hand, in a case where the moving work device has detached the second member from the attachment portion, since a combination of the first member and the second member is not changed, the second member is not set as a use restriction target. The management apparatus recognizes that the second member is automatically attached or detached by acquiring the cancelation information and the collecting information, excludes the second member from a restriction target such that the second member can be used thereafter. Therefore, in this management apparatus, the first member and the second member can be more appropriately handled in accordance with the work of the moving work device and the work of the operator. Here, the mounting-related device includes, for example, a printing device that prints a viscous fluid on a processing target object, a print inspection device that inspects a printing state or the like, a mounting device that performs a process of mounting a component on a processing target object, a mounting inspection device that inspects a mounting state or the like, a storage device that stores members used in the device, a conveyance device for a processing target object, and a reflow device that performs a reflow process. Examples of the processing target object include a board and a base material having a three-dimensional structure.

DESCRIPTION OF EMBODIMENTS

Figure 1:
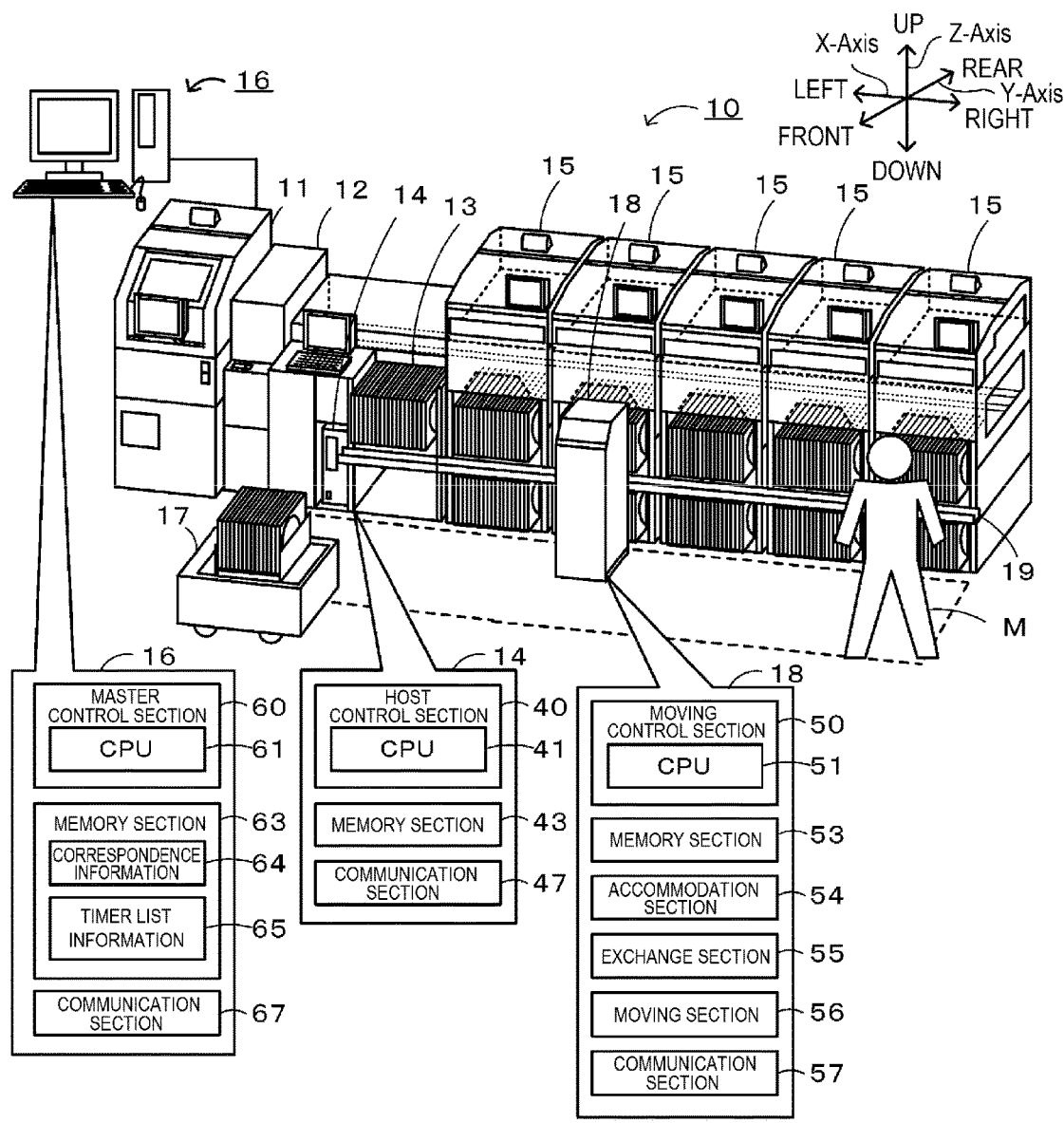
FIG. 1 is a schematic explanatory diagram illustrating an example of mounting system 10.
Figure 2:
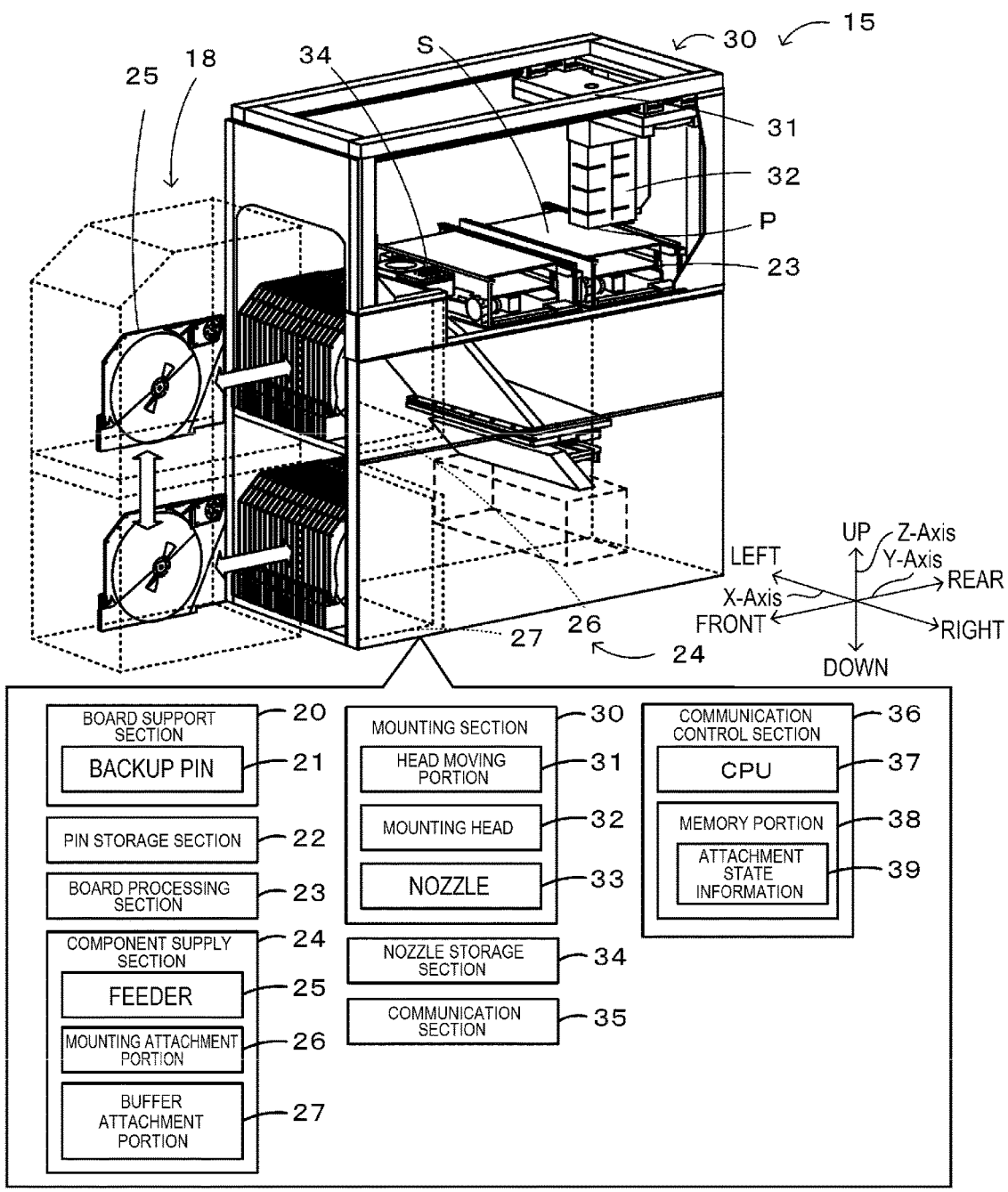
FIG. 2 is an explanatory diagram schematically illustrating a configuration of mounting device 15.
Figure 3:
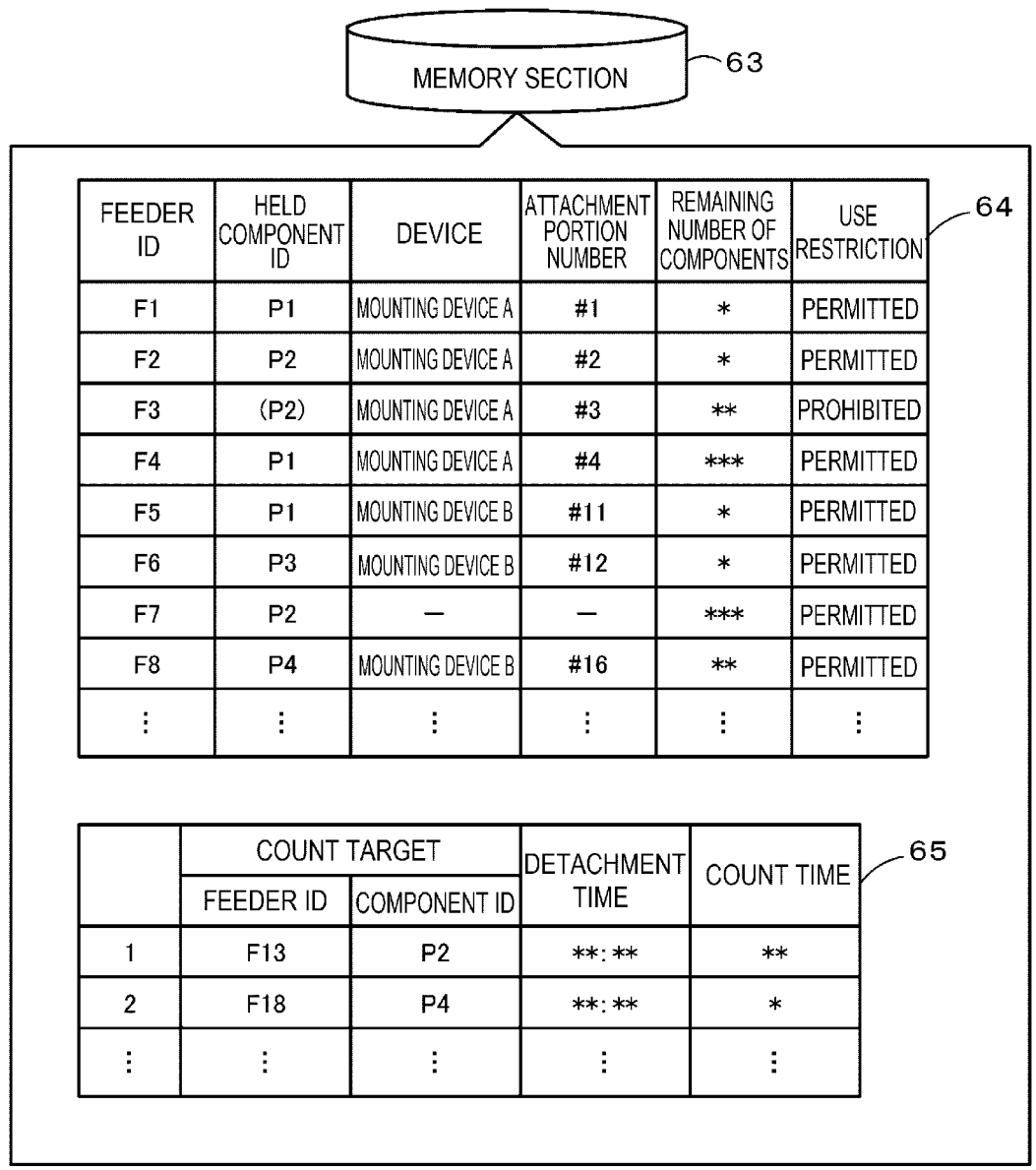
FIG. 3 is an explanatory diagram of correspondence information 64 and timer list information 65 stored in memory section 63.

Hereinafter, the present embodiment will be described with reference to the drawings. FIG. 1 is a schematic explanatory diagram illustrating an example of mounting system 10 of the present disclosure. FIG. 2 is an explanatory diagram schematically illustrating a configuration of mounting device 15. FIG. 3 is an explanatory diagram of correspondence information 64 and timer list information 65 stored in memory section 63. In the present embodiment, a left-right direction (X-axis), a front-rear direction (Y-axis), and an up-down direction (Z-axis) are as illustrated in FIGS. 1 and 2.

Mounting system 10 is configured, for example, as a production line in which mounting devices 15 performing a process of mounting components P on board S serving as a processing target object are arranged in a conveyance direction of board S. Here, a processing target object will be described as board S, but the processing target object is not particularly limited as long as it is a board on which component P is mounted, and may be a base material having a three-dimensional shape. As illustrated in FIG. 1, mounting system 10 is configured to include printing device 11, print inspection device 12, storage section 13, host PC 14, mounting device 15, a mounting inspection device (not illustrated), a reflow device (not illustrated), master PC 16, automatic conveyance vehicle 17, loader 18, and the like. Printing device 11 is a device that prints a solder paste or the like on board S. Print inspection device 12 is a device that inspects a state of the printed solder. The mounting inspection device is a device that inspects a state or the like of a component that has been subjected to a mounting process. The reflow device is a device that reflows a board on which a solder is printed and on which a component is mounted.

Mounting device 15 is a device that picks up component P and mounts component P on board S. As illustrated in FIG. 2, mounting device 15 includes board support section 20, pin storage section 22, board processing section 23, component supply section 24, mounting section 30, nozzle storage section 34, communication section 35, and mounting control section 36. Board support section 20 is a unit that supports board S from the lower side with backup pin 21. A position or type of backup pin 21 disposed on a support plate is changed according to the type of board S to be supported. Backup pin 21 is configured to be movable by mounting head 32. Pin storage section 22 is an accommodation member that accommodates backup pin 21. Pin storage section 22 is detachably disposed in the device, and may be replaced according to the type of board S. Board processing section 23 is a unit that carries in, conveys, fixes board S at a mounting position, and carries out board S.

Component supply section 24 is a unit that supplies component P to mounting section 30. Component supply section 24 attaches feeder 25 including a reel around which a tape serving as a holding member holding component P is wound to at least one attachment portion. Component supply section 24 includes mounting attachment portion 26 to which feeder 25 used for a mounting process is attached and a buffer attachment portion 27 to which spare feeder 25 is attached in an upper and lower stage. Here, mounting attachment portion 26 and buffer attachment portion 27 are collectively referred to as an attachment portion. Feeder 25 includes a controller (not illustrated). The controller stores information such as an ID of a tape included in feeder 25, and the type and a remaining number of components P. When feeder 25 is attached to the attachment portion, the controller transmits the information regarding feeder 25 to mounting control section 36. Component supply section 24 may include a tray unit having a tray as a holding member on which multiple components P are arranged and placed. Communication section 35 is an interface that exchanges information with external devices such as host PC 14, loader 18, and master PC 16.

Mounting section 30 is a unit that picks up component P from component supply section 24 and disposes component P on board S fixed to board processing section 23. Mounting section 30 includes head moving portion 31, mounting head 32, and nozzle 33. Head moving portion 31 includes a slider configured to move in the XY-directions while being guided by a guide rail, and a motor for driving the slider. Mounting head 32 picks up one or more components P and is moved in the XY-directions by head moving portion 31. Mounting head 32 is detachably attached to the slider. One or more nozzles 33 are detachably attached to a lower surface of mounting head 32. Nozzle 33 picks up component P by using a negative pressure. A pickup member that picks up component P may be a mechanical chuck or the like that mechanically holds component P in addition to nozzle 33. Nozzle storage section 34 is an accommodation member that accommodates nozzle 33. Nozzle storage section 34 is detachably disposed in the device. In nozzle storage section 34, nozzle 33 or the like of a type used in the next production is accommodated at a specific position, and may be replaced every time the nozzle is produced.

Mounting control section 36 is configured as a microprocessor centered on CPU 37, and controls the entire device. Mounting control section 36 has memory portion 38. Memory portion 38 stores mounting condition information (production job) including information such as information regarding components P, an arrangement order in which components P are mounted on board S, an arrangement position, and an attachment position of feeder 25 from which components P are picked up, attachment state information 39, and the like. Attachment state information 39 includes information regarding the current state of component supply section 24, such as the type (ID) of feeder 25 attached to mounting attachment portion 26, buffer attachment portion 27, or the like, the component type (ID) combined with feeder 25, and a remaining number of components. In attachment state information 39, a use status of feeder 25 is periodically updated by CPU 37 in accordance with consumption of components by mounting section 30, replacement of feeder 25 by loader 18 or operator M, or the like. Mounting control section 36 outputs control signals to board processing section 23, component supply section 24, and mounting section 30, and receives signals from board processing section 23, component supply section 24, and mounting section 30.

As illustrated in FIG. 1, storage section 13 is a storage location for temporarily storing feeder 25 used in mounting device 15. Storage section 13 is provided under a conveyance device between print inspection device 12 and mounting device 15. Storage section 13 has an attachment portion in the same manner as component supply section 24. When feeder 25 is connected to the attachment portion, the controller of feeder 25 outputs information regarding feeder 25, and host PC 14 receives the output information. In storage section 13, feeder 25 may be transported by automatic conveyance vehicle 17 or feeder 25 may be transported by operator M. Automatic conveyance vehicle 17 automatically conveys feeder 25, a member used in mounting system 10, and the like between a warehouse (not illustrated) and storage section 13.

Feeder 25 and other members are stored in the warehouse (not illustrated). In addition to the members, a warehouse PC, an arm robot, an electronic shelf, and the like are disposed in the warehouse. The warehouse PC manages members in the warehouse, performs input, and the like, and is connected to mounting system 10 via a network. The arm robot automatically attaches and detaches and moves feeder 25 between the electronic shelf and automatic conveyance vehicle 17. The electronic shelf has an attachment portion in the same manner as component supply section 24, and outputs information regarding feeder 25 attached to and detached from the attachment portion to the warehouse PC. In this warehouse, operator M prepares feeder 25 or the like used for subsequent production. For example, operator M combines feeder 25 and a reel holding component P, associates the respective IDs thereof, and inputs the associated IDs to the warehouse PC. The warehouse PC outputs the combination of feeder 25 and component P to master PC 16. Master PC 16 registers the acquired combination of feeder 25 and component P in correspondence information 64 and manages the combination.

Loader 18 is a mobile work device, which moves in a moving region in front of mounting system 10 (refer to dashed lines in FIG. 1), and is a device automatically attaching and detaching, and collecting and providing members necessary for a mounting process, such as feeder 25 of mounting device 15. Loader 18 includes moving control section 50, memory section 53, accommodation section 54, exchange section 55, moving section 56, and communication section 57. Moving control section 50 is configured as a microprocessor centered on CPU 51 and controls the entire device. Moving control section 50 controls the entire device such that feeder 25 is collected from component supply section 24 or feeder 25 is provided to component supply section 24, and feeder 25 is moved to and from storage section 13. Memory section 53 is, for example, an HDD that stores various data such as a processing program. Accommodation section 54 has an accommodation space for accommodating feeder 25. Accommodation section 54 is configured to accommodate, for example, four feeders 25. Exchange section 55 is a mechanism that moves feeder 25 in and out as well as moving feeder 25 in upper and lower stages (refer to FIG. 2). Exchange section 55 has a clamp portion that clamps feeder 25, a Y-axis slider that moves the clamp portion in the Y-axis direction (front-rear direction), and a Z-axis slider that moves the clamp portion in the Z-axis direction (up-down direction). Exchange section 55 executes attachment and detachment of feeder 25 at mounting attachment portion 26, and attachment and detachment of feeder 25 at buffer attachment portion 27. Moving section 56 is a mechanism that moves loader 18 in the X-axis direction (left-right direction) along X-axis rail 19 disposed in front of mounting device 15. Communication section 57 is an interface that exchanges information with external devices such as host PC 14 and mounting device 15. Loader 18 outputs the current position or details of executed work to host PC 14. Loader 18 is capable of collecting and providing feeder 25, but may be configured to collect and provide members related to the mounting process, such as mounting head 32, nozzle storage section 34 accommodating nozzle 33, a solder cartridge, a screen mask, and pin storage section 22 accommodating backup pin 21.

Host PC 14 is a device that manages loader 18. Host PC 14 includes management control section 40, memory section 43, and communication section 47. Management control section 40 is configured as a microprocessor centered on CPU 41 and controls the entire device. Memory section 43 stores an instruction list or the like including information supported by loader 18. Communication section 47 is an interface that exchanges information with external devices such as mounting device 15, loader 18, and master PC 16.

Master PC 16 is configured as a server that stores and manages information used by each device of mounting system 10, such as a production plan database including multiple pieces of mounting condition information. Master PC 16 has a function of a management apparatus that also manages feeder 25. Master PC 16 includes master control section 60, memory section 63, and communication section 67. Master control section 60 is configured as a microprocessor centered on CPU 61, and controls the entire device. In addition to the production plan database, correspondence information 64, timer list information 65, and the like are stored in memory section 63. Communication section 67 is an interface that exchanges information with external devices such as mounting device 15, loader 18, and host PC 14.

Here, the information stored in memory section 63 will be described with reference to FIG. 3. Correspondence information 64 is a database including a correspondence relationship between a combination of feeder 25 and component P. In correspondence information 64, an ID of feeder 25 and an ID of a held component that is held by an attached reel are correlated with each other, and in addition, a device that is currently attached and an attachment portion number, a remaining number of components, information regarding a restriction on the use of the feeder, and the like are correlated with each other. Timer list information 65 is a list for measuring a time period during which feeder 25 is detached from the attachment portion. Timer list information 65 includes an ID of feeder 25, a component ID, the time at which the attachment is started, the count time from that time, and the like. Although a correspondence relationship between feeder 25 and component P is managed in correspondence information 64, it is conceivable that the reel holding component P is replaced in a case where feeder 25 is detached from the attachment portion by operator M. Timer list information 65 is created in a case where the time for estimating whether the correspondence relationship is changed is measured.

Next, an operation of mounting system 10 of the present embodiment configured as described above, first, a process in which mounting device 15 mounts component P on board S will be described. When starting the mounting process, first, CPU 37 of mounting control section 36 causes mounting head 32 to execute a process of disposing backup pin 21 at a position corresponding to board S. Next, CPU 37 controls board processing section 23 to carry in and fix board S. Next, CPU 37 reads the mounting condition information, attaches nozzle 33 to be used from nozzle storage section 34 to mounting head 32 based on the mounting condition information, causes mounting head 32 to pick up component P from feeder 25 attached to component supply section 24, and performs a process of disposing component P on board S. When component P is disposed on board S, CPU 37 causes board S to be discharged to board processing section 23, and repeatedly performs the above process. CPU 37 manages the number of components consumed by each feeder 25 during the execution of the mounting process, and when a remaining number of components is equal to or less than a predetermined warning value, transmits the information to host PC 14. Host PC 14 performs, for example, a process of adding an exchange operation for feeder 25 close to component shortage to an instruction list. Host PC 14 causes loader 18 to execute the exchange operation based on the instruction list. Loader 18 is moved between storage section 13 and mounting device 15 along X-axis rail 19, and executes a replacement process for feeder 25 in mounting device 15 that is a work target.

Figure 4:
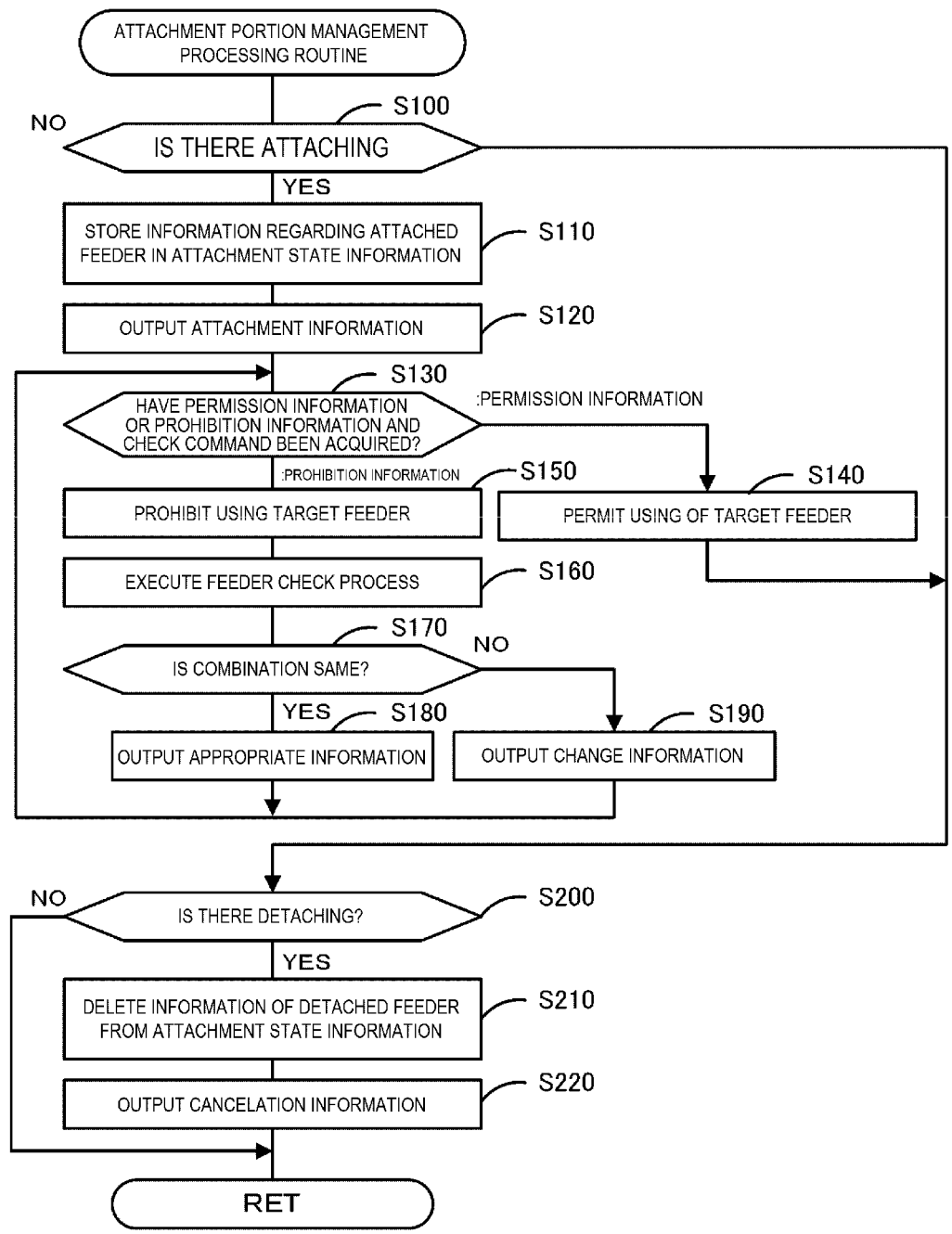
FIG. 4 is a flowchart illustrating an example of an attachment portion management processing routine.

Next, management of feeder 25 attached to the attachment portion in mounting device 15 will be described. FIG. 4 is a flowchart illustrating an example of an attachment portion management processing routine executed by mounting control section 36 of mounting device 15. This routine is stored in memory portion 38 of mounting control section 36, and is executed at predetermined intervals (for example, at intervals of several seconds) after mounting device 15 is started. When this routine is started, CPU 37 of mounting control section 36 determines whether there is an attachment portion to which feeder 25 is newly attached (S100). When there is an attachment portion to which feeder 25 is attached, CPU 37 stores information regarding feeder 25 attached to the attachment portion in attachment state information 39 (S110). The information regarding feeder 25 includes, for example, a feeder ID, a component ID, and a remaining number of components, and is stored in attachment state information 39 in correlation with a number of the attachment portion number to which the feeder is attached.

Next, CPU 37 outputs attachment information indicating that feeder 25 is attached to the attachment portion to master PC 16 (S120), and waits until a response is received from master PC 16. Master PC 16 determines whether attached feeder 25 is usable, and outputs permission information or prohibition information and a check command to corresponding mounting device 15. The prohibition information is set in a case where feeder 25 is detached by operator M and is reattached after a lapse of a time period during which the reels can be exchanged. Operator M may attach an inappropriate reel to feeder 25, and thus mounting device 15 imposes a restriction on the use of such feeder 25. The check command is a command for executing a process of checking whether a correspondence relationship of a combination of feeder 25 and component P is changed by mounting device 15.

After S120, CPU 37 determines whether the permission information or the prohibition information or the check command has been acquired (S130), and when the permission information has been acquired, CPU 37 permits the use of attached target feeder 25 (S140). On the other hand, when the prohibition information and the check command have been acquired from master PC 16 in S130, CPU 37 prohibits the use of attached target feeder 25 (S150), and executes a process of checking this feeder 25 (S160). In the check process, CPU 37 acquires an ID of feeder 25 and an ID of component P, and executes a process of collating the IDs. CPU 37 automatically or manually reads and acquires the ID of component P from the reel with a reading section (not illustrated). Due to execution of the check process, mounting device 15 may temporarily suspend production of board S.

When the check process is executed in S160, CPU 37 determines whether the combination of feeder 25 and component P has been changed based on the correspondence relationship in correspondence information 64 in master PC 16 (S170). When there is no change of the combination, CPU 37 outputs appropriate information indicating the fact to master PC 16 (S180), and when there is a change of the combination, outputs change information indicating the fact to master PC 16 (S190), and performs the processes in and after S130. When the appropriate information is acquired, master PC 16 cancels the use restriction and outputs the permission information to mounting device 15, and when the change information is acquired, changes the combination in correspondence information 64 and outputs the permission information to mounting device 15.

After S140 or when feeder 25 is not attached to the attachment portion in S100, CPU 37 determines whether there is an attachment portion from which feeder 25 is detached (S200). When there is no attachment portion from which feeder 25 is detached, CPU 37 finishes this routine without further processing. On the other hand, when there is an attachment portion from which feeder 25 is detached, information regarding detached feeder 25 is deleted from attachment state information 39 (S210), cancelation information indicating the fact is output to master PC 16 (S220), and the routine is finished.

Next, a process in which loader 18 collects and provides feeder 25 will be described. When a command based on the instruction list is acquired from host PC 14, CPU 51 of moving control section 50 moves feeder 25 for which the command is given. For example, CPU 51 causes exchange section 55 to detach feeder 25 from a specific attachment portion in storage section 13, moves feeder 25 to moving section 56 in a state in which feeder 25 is accommodated in accommodation section 54 to a specific attachment portion of mounting device 15, and controls the exchange section 55 to attach feeder 25 to the attachment portion. CPU 51 moves moving section 56 to the specific attachment portion of mounting device 15, and causes exchange section 55 to detach feeder 25 from the attachment portion. Every time feeder 25 is detached from any of the attachment portions, CPU 51 outputs collecting information indicating this fact to host PC 14. Host PC 14 immediately outputs the collecting information acquired from loader 18 to master PC 16. Master PC 16 can recognize that loader 18 has executed the detachment of feeder 25 for which the collecting information has been acquired.

Figure 5:
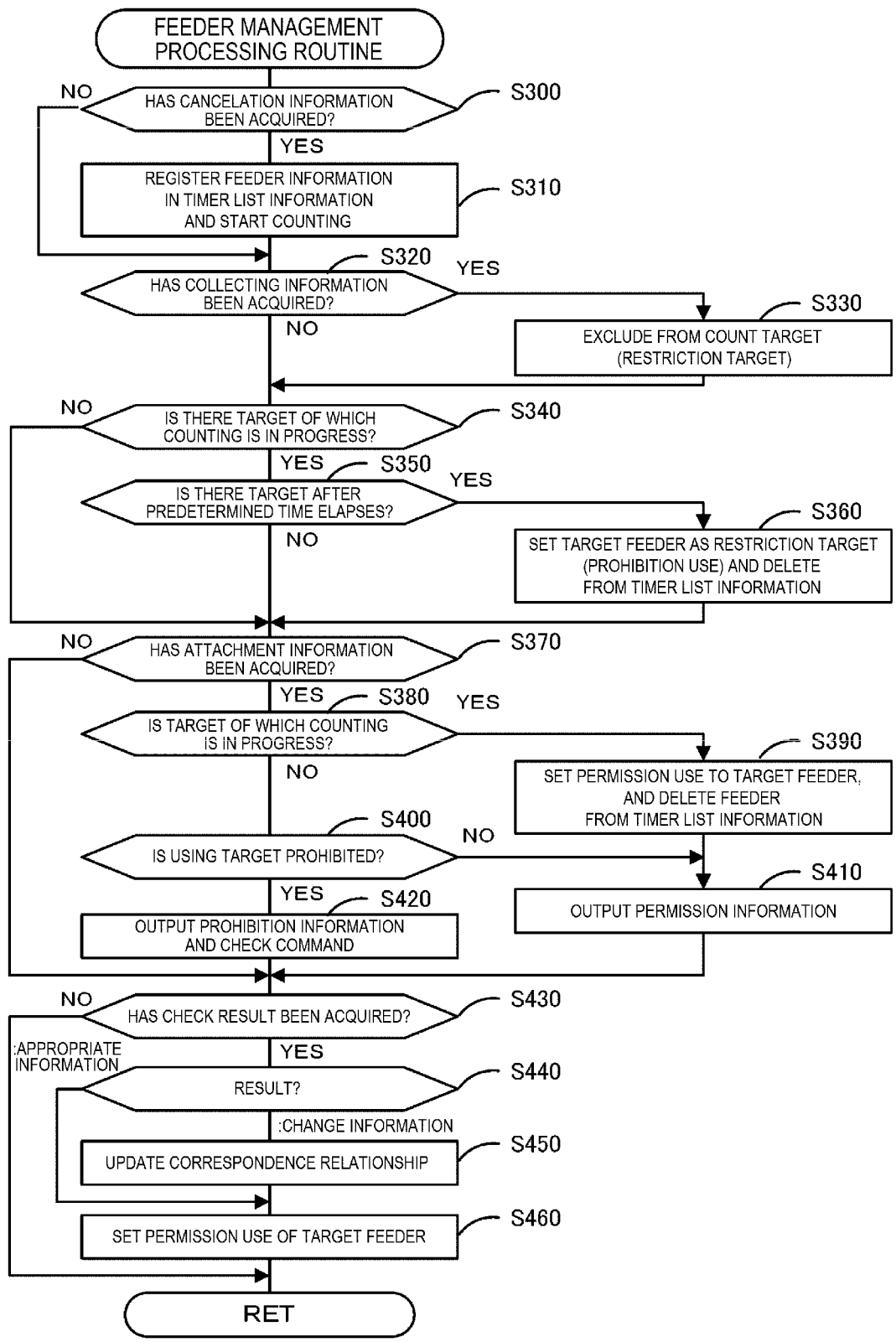
FIG. 5 is a flowchart illustrating an example of a feeder management processing routine.

Next, a process in which master PC 16 performs management related to feeder 25 including a restriction on the use of feeder 25 will be described. FIG. 5 is a flowchart illustrating an example of a feeder management processing routine executed by master control section 60 of master PC 16. This routine is stored in memory section 63 of master control section 60, and is executed at predetermined intervals (for example, at intervals of several seconds) after master PC 16 is started. When this routine is started, CPU 61 of master control section 60 determines whether cancelation information has been acquired from any of mounting devices 15 (S300). When the cancelation information has been acquired, CPU 61 registers information regarding detached feeder 25 in timer list information 65, and starts counting a time period during which feeder 25 is detached from mounting device 15 (S310).

After S310 or when the cancelation information is not acquired in S300, CPU 61 determines whether collecting information has been acquired from loader 18 (S320). When the collecting information has been acquired, CPU 61 excludes corresponding feeder 25 from count targets that are restriction targets (S330). CPU 61 performs a process of deleting corresponding feeder 25 from timer list information 65. For feeder 25 for which the collecting information has been acquired from loader 18 is excluded from a time count target in timer list information 65 since feeder 25 is detached in loader 18 and there is no unintended reel replacement. Thereafter, in mounting device 15, the combination of corresponding feeder 25 and component P included in correspondence information 64 is effectively handled.

After S330 or when the collecting information is not acquired in S320, CPU 61 determines whether there is feeder 25 for which counting is in progress in timer list information 65 (S340), and when there is feeder 25 for which counting is in progress, determines whether there is feeder 25 for which a predetermined time has elapsed in timer list information 65 (S350). The predetermined time may be set based on a time period (40 seconds or one minute) during which operator M can exchange reels. When there is feeder 25 for which the predetermined time has elapsed in timer list information 65, target feeder 25 is set to a use prohibition target that is a restriction target, and is deleted from timer list information 65 (S360). CPU 61 registers use prohibition information for corresponding target feeder 25 of correspondence information 64 (refer to FIG. 3).

After S360, or when there is no target feeder 25 for which a predetermined time has elapsed in S350, or when there is no feeder 25 for which counting is in progress in S340, CPU 61 determines whether attachment information has been acquired from any of mounting devices 15 (S370). When the attachment information has been acquired, CPU 61 determines whether target feeder 25 is a feeder for which counting is in progress in timer list information 65 (S380). When target feeder 25 is a feeder for which counting is in progress, CPU 61 determines that feeder 25 is immediately reattached and reel exchange has not been performed on target feeder 25, and thus sets permission use and deletes corresponding feeder 25 information from timer list information 65 (S390). On the other hand, when target feeder 25 is not a feeder for which counting is in progress in S380, CPU 61 determines whether target feeder 25 is prohibited from being used based on the use restriction information in correspondence information 64 (S400). When target feeder 25 is not prohibited from being used, or after S390, CPU 61 outputs permission information, indicating a permission use, to corresponding mounting device 15 (S410). Mounting device 15 that has received the permission information starts to use attached feeder 25. On the other hand, when target feeder 25 is prohibited from being used in S400, CPU 61 outputs a check command together with prohibition information indicating a restriction on the use of feeder 25 (S420). Mounting device 15 that has received the check command and the prohibition information prohibits the use of attached feeder 25 and executes a check process. As described above, in mounting device 15, when target feeder 25 is set as a restriction target, the validity of the combination of corresponding feeder 25 and component P included in correspondence information 64 is suspended, and the check process is executed.

After S410 and S420 or when the attachment information is not acquired in S370, CPU 61 determines whether information regarding a result of the check process has been acquired (S430). When the result of the check process has been acquired, CPU 61 determines which of the appropriate information and the change information has been acquired (S440), and when the change information has been acquired, CPU 61 updates correspondence information 64 by correlating information regarding combined new component P with target feeder 25 (S450). After 450 or when the appropriate information has been acquired in S440, CPU 61 changes the restriction on the use of corresponding target feeder 25 from prohibition to permission to update correspondence information 64 (S460), and finishes this routine.

Here, correspondence relationships between constituents of the present embodiment and constituents of the present disclosure will be clarified. Master control section 60 of the present embodiment corresponds to a management control section of the present disclosure, memory section 63 corresponds to a memory section, component P corresponds to a first member, feeder 25 corresponds to a second member, master PC 16 corresponds to a management apparatus, and loader 18 corresponds to a mobile work device. Printing device 11, print inspection device 12, storage section 13, mounting device 15, and the like correspond to mounting-related devices, mounting attachment portion 26, buffer attachment portion 27, and the attachment portion of storage section 13 correspond to attachment portions, and board S corresponds to a processing target object. In the present embodiment, an example of the management method of the present disclosure is also clarified by describing the operations of host PC 14 and mounting device 15.

Master PC 16 of the present embodiment described above performs a process of setting this feeder 25 as a restriction target when cancelation information indicating that feeder 25 used in combination with component P has been detached from the attachment portion of mounting device 15 is acquired and collecting information indicating that loader 18 has detached feeder 25 from the attachment portion is not acquired. On the other hand, master PC 16 performs a process of excluding feeder 25 from a restriction target when cancelation information indicating that feeder 25 has been detached from the attachment portion of mounting device 15 is acquired and collecting information indicating that loader 18 has detached feeder 25 from the attachment portion is acquired. For example, in a case where operator M has detached feeder 25 from the attachment portion, since there is a probability that operator M may change component P combined with feeder 25, feeder 25 is set as a use restriction target. On the other hand, when loader 18 detaches feeder 25 from the attachment portion, a combination of component P and feeder 25 is not changed, and thus feeder 25 is not set as a use restriction target. Master PC 16 recognizes that feeder 25 is automatically attached or detached by loader 18 by acquiring the cancelation information and the collecting information, excludes feeder 25 from a restriction target such that feeder 25 can be used thereafter. Therefore, master PC 16 can more appropriately handle component P and feeder 25 in accordance with the work of loader 18 and the work of operator M.

Master control section 60 starts counting the time when the cancelation information is acquired, and sets feeder 25 as a restriction target when the collecting information for corresponding feeder 25 is not acquired within a predetermined time, and excludes feeder 25 from a restriction target and does not count the time when the cancelation information and the collecting information for corresponding feeder 25 are acquired. In master PC 16, by counting the time, it is possible to obtain a range in which a combination of component P and feeder 25 is not changed and thus to optimize a restriction target. Master control section 60 permits the use of feeder 25 when corresponding feeder 25 is reattached to the attachment portion within a predetermined time. Master PC 16 can more appropriately manage reattached feeder 25. Master PC 16 includes memory section 63 storing correspondence information 64 including a correspondence relationship between component P and feeder 25, and master control section 60 acquires information indicating that feeder 25 has been reattached to the attachment portion, does not validate the combination included in correspondence information 64 and does not permit the use of feeder 25 when feeder 25 is a restriction target, and validates the combination included in correspondence information 64 and permits the use of feeder 25 when feeder 25 is not a restriction target. In master PC 16, since there is a high probability that the combination of component P and feeder 25 may be changed in feeder 25 that is a restriction target, correspondence information 64 can be more appropriately handled according to whether feeder 25 is a restriction target. When the use of feeder 25 based on correspondence information 64 is not permitted, master control section 60 outputs a check command for checking a combination in correspondence information 64 including the correspondence relationship between feeder 25 and component P to mounting device 15 to which feeder 25 is attached. By checking the correspondence relationship in correspondence information 64, master PC 16 can more appropriately handle correspondence information 64. In master PC 16, since the first member is component P and the second member is feeder 25 that supplies component P, these members can be more appropriately handled in such a combination thereof in accordance with the work of loader 18 and the work of operator M.

Needless to say, the present disclosure is not limited to the embodiment that has been described heretofore, and hence, the present disclosure can be carried out in various aspects without departing from the technical scope of the present disclosure.

For example, in the above embodiment, master control section 60 counts the time period during which feeder 25 is detached after acquiring the cancelation information; however, the configuration is not limited to this, and the counting of the time period may be omitted. In this case, for example, when only the cancelation information is acquired, master control section 60 may set corresponding feeder 25 as a restriction target, and when the cancelation information and the collecting information are acquired, exclude corresponding feeder 25 from a restriction target. Master control section 60 permits the use of corresponding feeder 25 in a case where feeder 25 is reattached within a predetermined time, but may also omit this process by omitting the time counting. Also in this master PC 16, it is possible to more appropriately handle component P and feeder 25 in accordance with the work of loader 18 and the work of operator M.

In the above embodiment, correspondence information 64 is stored in memory section 63, and the validity of the corresponding combination included in correspondence information 64 is suspended when feeder 25 is a restriction target to perform a check process; however, the configuration is not limited to this, and correspondence information 64 itself may be omitted, or output of the check information may be omitted such that execution of the check process for correspondence information 64 is omitted. Also in this master PC 16, it is possible to more appropriately handle component P and feeder 25 in accordance with the work of loader 18 and the work of operator M.

In the above embodiment, a process related to whether to set feeder 25 as a restriction target is performed in duty ratio attachment or detachment at the attachment portion of mounting device 15; however, the configuration is not limited to this, a processing related to whether to set feeder 25 as a restriction target may be performed during attachment or detachment of feeder 25 in a location other than mounting device 15, such as attachment or detachment at the attachment portion of storage section 13 or attachment or detachment at the attachment portion of the electronic shelf of the warehouse. Also in this mounting system 10, it is possible to more appropriately handle component P and feeder 25 in accordance with the work of loader 18 and the work of operator M.

In the above embodiment, the description has been made in which the first member is component P, and the second member used in combination is feeder 25; however, the configuration is not limited to this as long as the first member and the second member are used in combination and the second member is attached to the attachment portion. For example, the first member may be component P, and the second member may be a tray on which component P is placed. The first member may be a pickup member (nozzle 33) that picks up component P, and the second member may be an accommodation member (nozzle storage section 34) that accommodates one or more pickup members. The first member may be a support member (backup pin 21) that supports board S from the lower side, and the second member may be an accommodation member (pin storage section 22) that accommodates one or more support members. The first member may be mounting head 32, and the second member may be a head storage section that can store, detach, and move one or more mounting heads 32. It is assumed that the moving work device automatically attaches and detaches any of the second members, and operator M also attaches and detaches the second member. Also in this case, the first member and the second member can be appropriately handled according to the operation of the moving work device and the operation of operator M.

In the above embodiment, the present disclosure has been described as mounting system 10, master PC 16, and mounting device 15, but the present disclosure may be a management method executed by master PC 16 or a program for realizing the management method.

Here, the information processing device and the information processing method of the present disclosure may be configured as follows. For example, in the management apparatus of the present disclosure, the management control section may start counting of time when the cancelation information is acquired, set the second member as a restriction target when the collecting information for the corresponding second member is not acquired within a predetermined time, and exclude the second member from the restriction target and omit the counting of time when the cancelation information and the collecting information for the corresponding second member are acquired. In this management apparatus, by counting the time, it is possible to obtain a range in which the combination of the first member and the second member is not changed, so that the restriction target can be optimized. In the management apparatus, the management control section may permit the use of the second member when the corresponding second member is reattached within the predetermined time. In this management apparatus, the reattached second member can be more appropriately managed. Here, the predetermined time may be determined based on a time required to change a combination of the first member and the second member.

The management apparatus of the present disclosure may include a memory section that stores correspondence information including a correspondence relationship between the first member and the second member, in which the management control section may acquire information indicating that the second member is reattached to the attachment portion, and may not permit the use of the second member based on the correspondence information when the second member is the restriction target, and may permit the use of the second member based on the correspondence information when the second member is not the restriction target. In this management apparatus, since there is a high probability that the combination of the first member and the second member may be changed in the second member that is the restriction target, the correspondence information can be more appropriately handled according to whether the second member is the restriction target. Here, the expression "use of the second member based on the correspondence information" may mean "use of the second member on the assumption that the combination included in the correspondence information is valid".

In the management apparatus of the present disclosure storing correspondence information, when the use of the second member based on the correspondence information is not permitted, the management control section may output a command for checking the correspondence information including the correspondence relationship between the second member and the first member to a mounting-related device to which the second member is attached. In this management apparatus, by checking the correspondence relationship in the correspondence information, the correspondence information can be more appropriately handled.

In the management apparatus according to the present disclosure, any one or more of (1) to (4) may be satisfied. For example, since a component and a feeder, a component and a tray, a pickup member and an accommodation member, and a support member and an accommodation member are used in combination, the management apparatus can more appropriately handle these members in accordance with the work of the moving work device and the work of the operator. (1) The first member is a component, and the second member is a feeder that supplies the component. (2) The first member is a component, and the second member is a tray on which the component is placed. (3) The first member is a pickup member that picks up a component, and the second member is an accommodation member that accommodates one or more of the pickup members. (4) The first member is a support member that supports a board from below, and the second member is an accommodation member that accommodates one or more of the support members.

The mounting system of the present disclosure includes multiple mounting-related devices each having an attachment portion to which a second member used in combination with a first member is attached and related to a process of mounting a component on a processing target object, a moving work device that is moved between the mounting-related devices and automatically attaches and detaches the second member to and from the attachment portion, and any one of the management apparatuses described above. In this mounting system, since the management apparatus described above is provided, the first member and the second member can be more appropriately handled in accordance with the work of the moving work device and the work of the operator. It is possible to achieve effects according to aspects of the employed management apparatus.

The management method of the present disclosure is a management method used in a mounting system including multiple mounting-related devices each having an attachment portion to which a second member used in combination with a first member is attached and related to a process of mounting a component on a processing target object, and a moving work device that is moved between the mounting-related devices and automatically attaches and detaches the second member to and from the attachment portion, the management method including (a) a step of, when cancelation information indicating that the second member has been detached from the attachment portion of the mounting-related device is acquired and collecting information indicating that the moving work device has detached the second member from the attachment portion is not acquired, executing a process of setting the second member as a restriction target; and (b) a step of, when the cancelation information indicating that the second member has been detached from the attachment portion of the mounting-related device is acquired and the collecting information indicating that the moving work device has detached the second member from the attachment portion is acquired, executing a process of excluding the second member from the restriction target.

In this management method, similarly to the management apparatus described above, by acquiring the cancelation information and the collecting information, it is recognized that the second member is automatically attached or detached, and the second member is excluded from the restriction target to be used thereafter. Therefore, in this management method, the first member and the second member can be more appropriately handled in accordance with the work of the moving work device and the work of the operator. This management method may employ the aspect of the management apparatus described above, or may include a step of realizing the function of the management apparatus described above.

INDUSTRIAL APPLICABILITY

The management apparatus, the mounting system, and the management method of the present disclosure can be used in the field of mounting electronic components.

REFERENCE SIGNS LIST 10 mounting system, 11 printing device, 12 print inspection device, 13 storage section, 14 host PC, 15 mounting device, 16 master PC, 17 automatic conveyance vehicle, 18 loader, 19 x-axis rail, 20 board support section, 21 backup pin, 22 pin storage section, 23 board processing section, 24 component supply section, 25 feeder, 26 mounting attachment portion, 27 buffer attachment portion, 30 mounting section, 31 head moving portion, 32 mounting head, 33 nozzle, 34 nozzle storage section, 35 communication section, 36 mounting control section, 37 CPU, 38 memory portion, 39 attachment state information, 40 management control section, 41 CPU, 43 memory section, 47 communication section, 50 moving control section, 51 CPU, 53 memory section, 54 accommodation section, 55 exchange section, 56 moving section, 57 communication section, 60 master control section, 61 CPU, 63 memory section, 64 correspondence information, 65 timer list information, 67 communication section, M operator, P component, S board

The invention claimed is:

1. A management apparatus used in a mounting system including multiple mounting-related devices each being one of a printing device, printing inspection device, storage section, or mounting device and having an attachment portion to which a second member used in combination with a first member is attached for performing a process of mounting a component on a processing target object, and a moving work device that is moved between the mounting-related devices and automatically attaches and detaches the second member to and from the attachment portion, the management apparatus comprising:
- a management control section including a processor configured to
- determine whether cancelation information indicating that the second member has been detached from the attachment portion from one of the mounting-related devices has been acquired,
- register information that time counting is in progress for the second member in timer list information and start counting a time period during which the second member has been detached from the attachment portion from the one of the mounting-related devices when it is determined that the cancelation information indicating that the second member has been detached from the attachment portion of the mounting-related device is has been acquired,
- determine whether collecting information indicating that the moving work device has detached the second member from the attachment portion is not of the moving work device has been acquired,
- execute a process of excluding the second member from a restriction target when it is determined that the collecting information indicating that the moving work device has detached the second member from the attachment portion has been acquired,
- when it is determined that the collecting information indicating that the moving work device has detached the second member from the attachment portion is has not been acquired
  - determine whether there is time counting is in progress for the second member in the timer list information,
  - when it is determined that there is time counting in progress for the second member in the timer list information and the time period is greater than a predetermined time period, execute a process of setting the second member as the restriction target and deleting the second member from the timer list information,
  - when it is determined that there is no time counting in progress for the second member in the timer list information, or it is determined that there is time counting in progress for the second member in the timer list information and the time period is less than the predetermined time period, determine whether attachment information has been acquired from any of the mounting-related devices, and
  - when it is determined there is time counting in progress for the second member in the timer list information in which the attachment information has been acquired, execute a process of setting permission use for the second member and deleting the second member from the timer list information.

2. The management apparatus according to claim 1, further comprising: a memory section configured to store correspondence information including a correspondence relationship between the first member and the second member.

3. The management apparatus according to claim 2, wherein the management control section is configured to not permit use of the second member based on the correspondence information and output a command for checking the correspondence information including a correspondence relationship between the second member and the first member to the mounting-related device to which the second member is attached when it is determined there is no time counting in progress for the second member in the timer list information in which the attachment information has been acquired.

4. The management apparatus according to claim 1, wherein at least one of (1) to (4) are satisfied:
(1) the first member is a component, and the second member is a feeder that supplies the component;
(2) the first member is a component, and the second member is a tray on which the component is placed;
(3) the first member is a pickup member that picks up a component, and the second member is an accommodation member that accommodates one or more pickup members; and
(4) the first member is a support member that supports a board from below, and the second member is an accommodation member that accommodates one or more support members.

5. A mounting system comprising:
multiple mounting-related devices each being one of a printing device, printing inspection device, storage section, or mounting device and having an attachment portion to which a second member used in combination with a first member is attached and related to a process of mounting a component on a processing target object;
a moving work device that is moved between the mounting-related devices and automatically attaches and detaches the second member to and from the attachment portion; and
the management apparatus according to claim 1.

* * * * *